(12) United States Patent
Arun Kumar et al.

(10) Patent No.: US 11,533,809 B2
(45) Date of Patent: Dec. 20, 2022

(54) THREE DIMENSIONAL PRINTED RESISTOR FOR DOWNHOLE APPLICATIONS

(71) Applicant: Schlumberger Technology Corporation, Sugar Land, TX (US)

(72) Inventors: Swapna Arun Kumar, Sugar Land, TX (US); Srinand Karuppoor, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 239 days.

(21) Appl. No.: 16/599,554

(22) Filed: Oct. 11, 2019

(65) Prior Publication Data
US 2021/0112660 A1 Apr. 15, 2021

(51) Int. Cl.
| | |
|---|---|
| H05K 1/16 | (2006.01) |
| H05K 1/02 | (2006.01) |
| B22F 10/00 | (2021.01) |
| H01C 1/01 | (2006.01) |
| H01C 7/00 | (2006.01) |

(52) U.S. Cl.
CPC ............ *H05K 1/167* (2013.01); *B22F 10/00* (2021.01); *H01C 1/01* (2013.01); *H01C 7/006* (2013.01); *H05K 1/0296* (2013.01)

(58) Field of Classification Search
CPC .......... H01C 1/01; H01C 7/006; H05K 1/167; H05K 1/0296; H05K 1/11; H05K 1/18
See application file for complete search history.

(56) References Cited

U.S. PATENT DOCUMENTS

| | | | |
|---|---|---|---|
| 4,943,346 A | 7/1990 | Mattelin | |
| 5,264,061 A | 11/1993 | Juskey et al. | |
| 5,278,442 A | 1/1994 | Prinz et al. | |
| 6,515,233 B1 | 2/2003 | Labzentis et al. | |
| 7,595,716 B2* | 9/2009 | Goto | H01C 17/06506 338/307 |
| 7,915,996 B2* | 3/2011 | Goto | H01C 17/065 338/195 |
| 8,628,818 B1 | 1/2014 | Sharma et al. | |
| 8,927,899 B2 | 1/2015 | Hofmann | |
| 8,943,682 B2 | 2/2015 | Cok et al. | |
| 9,431,375 B2 | 8/2016 | Defretin et al. | |
| 10,379,140 B2 | 8/2019 | Ekin | |
| 10,839,992 B1* | 11/2020 | Klek | H01C 17/2416 |

(Continued)

OTHER PUBLICATIONS

Office Action issued in U.S. Appl. No. 16/599,540 dated Jun. 24, 2020 (8 pages).

(Continued)

*Primary Examiner* — Kyung S Lee
(74) *Attorney, Agent, or Firm* — Trevor G. Grove

(57) ABSTRACT

Aspects of the disclosure relate to apparatus and methods for producing a downhole electrical component, having steps of providing a non-conductive polymer substrate, establishing an active area on the non-conductive polymer substrate, patterning the active area on the non-conductive polymer substrate with a conductive material through an additive manufacturing process and incorporating the patterned non-conductive polymer substrate into a final arrangement.

4 Claims, 4 Drawing Sheets

(56) References Cited

U.S. PATENT DOCUMENTS

| | | | |
|---|---|---|---|
| 2004/0083605 A1 | 5/2004 | Recktenwald et al. | |
| 2004/0255458 A1* | 12/2004 | Williams | H01L 24/76 257/E23.033 |
| 2007/0172735 A1 | 7/2007 | Hall et al. | |
| 2007/0279182 A1* | 12/2007 | Kodas | H01C 17/065 338/22 R |
| 2008/0135282 A1 | 6/2008 | Jonnalagadda et al. | |
| 2010/0055941 A1 | 3/2010 | Dittmann et al. | |
| 2010/0109834 A1* | 5/2010 | Kosowsky | H01C 7/12 338/314 |
| 2013/0153834 A1* | 6/2013 | Kumashiro | C08K 3/041 252/511 |
| 2014/0123487 A1 | 5/2014 | Lee | |
| 2016/0027562 A1* | 1/2016 | Feng | H01C 17/22 338/308 |
| 2016/0126110 A1 | 5/2016 | Yang | |
| 2017/0189995 A1* | 7/2017 | Zenou | B23K 26/34 |
| 2018/0017201 A1 | 1/2018 | Dupont et al. | |
| 2018/0135408 A1 | 5/2018 | Cooley et al. | |
| 2018/0326488 A1 | 11/2018 | Lappas et al. | |
| 2021/0112663 A1 | 4/2021 | Arun Kumar et al. | |

OTHER PUBLICATIONS

Tan et al., A review of printed passive electronic components through fully additive manufacturing methods, Virtual and Physical Prototyping, vol. 11, Issue 4, pp. 1-18, Aug. 2016.

Office Action issued in U.S. Appl. No. 16/599,540 dated May 28, 2021, 11 pages.

Office Action issued in U.S. Appl. No. 16/599,540 dated Jan. 31, 2022, 10 pages.

Office Action issued in U.S. Appl. No. 16/599,540 dated Jan. 12, 2021, 12 pages.

Office Action issued in U.S. Appl. No. 16/599,540, dated Apr. 6, 2022, 12 pages.

* cited by examiner

THREE DIMENSIONAL PRINTED RESISTOR FOR DOWNHOLE APPLICATIONS

CROSS REFERENCE TO RELATED APPLICATIONS

None.

STATEMENT REGARDING FEDERALLY SPONSORED RESEARCH OR DEVELOPMENT

None.

FIELD OF THE DISCLOSURE

Aspects of the disclosure relate to electrical components. More specifically, aspects of the disclosure relate to electrical components for downhole applications.

BACKGROUND INFORMATION

Composite film resistors are manufactured with film material printed on a screen or deposited on a ceramic substrate. A composite assembly is end terminated with an inner electrode and a plating material to facilitate assembly of the resistors on a printed circuit board. Conventional film resistors are made from a conductive metal oxide paste. Such conventional film resistors are satisfactory for low wattage values.

Other types of resistors are made from wire that is wound by specialized machines. These specialized machines are made to prepare one type of resistor. No capability of alterations to a pre-made resistor configuration may be made.

While the technology of creating these conventional apparatus is known, these types of resistors have several drawbacks. Often, in the case of film resistors, these resistors fail at downhole conditions with exposure to high temperatures. Downhole environments are also prone to producing high shocks for components placed in the environment.

Downhole environments may vary according to the location of a wellbore. In some areas, geothermal hot spots exist, thus components must be able to be configured to resist these increased temperatures. In some wellbores, localized over-pressure conditions may exist, thus pressures may be higher within some wellbores than others.

As these environments can widely vary, designers for downhole components may specifically tailor a downhole electrical tool and/or components for the anticipated conditions. Designing a downhole tool for an environmental condition much harsher than anticipated may be cost prohibitive as special precautions taken may be expensive to produce. There is a need, therefore, to produce components such that changes may be incorporated into the component into a quick basis and minimizes the costs for production of the components.

Production of conventional circuit boards and devices also have a negative environmental impact. Circuit boards are manufactured using multiple steps. These steps include using chemicals with solvents and acids to create traces in board materials. As the design becomes more complex, the amount of chemicals used increases, exposing manufacturers to regulations and environmental compliance concerns. As reduction of the use of chemicals can be beneficial from an economic standpoint, there is a need to provide for production of electrical components without the need for the use of chemicals.

There is a need to produce electrical components such that the components are not only fit for a particular purpose but may also be altered at the direction of a designer to allow for varying capabilities of the electrical component produce.

There is a need to provide a three dimensional (3D) resistor that is capable of withstanding anticipated temperature and shock conditions of a downhole environment.

There is a further need to provide a method of making a three dimensional resistor that is capable of withstanding anticipated temperature and shock conditions of the downhole environment.

There is a still further need to provide an economical alternative to conventional resistor apparatus that allows for quick prototyping.

There is a still further need to provide a quickly scalable apparatus to more accurately tighten or loosen arrangements that are currently operated by manual closure methods.

There is a further need to provide a method and apparatus to close fluid end units that are safer for workers than conventional closure methods and apparatuses.

There is a further need to produce electrical components wherein such production minimizes impacts to the environment.

SUMMARY

So that the manner in which the above recited features of the present disclosure can be understood in detail, a more particular description of the disclosure, briefly summarized below, may be had by reference to embodiments, some of which are illustrated in the drawings. It is to be noted that the drawings illustrate only typical embodiments of this disclosure, and are therefore not to be considered limiting of its scope, for the disclosure may admit to other equally effective embodiments without specific recitation. Accordingly, the following summary provides just a few aspects of the description and should not be used to limit the described embodiments to a single concept.

In one embodiment, a method for producing a downhole electrical component is disclosed. The method may comprise providing a non-conductive polymer substrate. The method may also provide for establishing an active area on the non-conductive polymer substrate. The method may also provide for patterning the active area on the non-conductive polymer substrate with a conductive material through an additive manufacturing process. The method may also provide for incorporating the patterned non-conductive polymer substrate into a final arrangement.

In one non-limiting embodiment, an arrangement is disclosed. The arrangement may comprise a substrate having at least two areas, wherein a first of the two areas is an active area and a second of the two areas is a passive area. The arrangement may also comprise at least one resistive pattern placed in a surface of the active area, the at least one resistive pattern placed onto the substrate through an additive manufacturing process. The arrangement may also comprise a first connection pad connected to the at least one resistive pattern placed in the surface of the active area. The arrangement may also comprise a second connection pad connected to the at least one resistive pattern placed in the surface of the active area.

In another non-limiting embodiment, a method for producing a downhole electrical component is disclosed. The method may comprise providing a non-conductive polymer substrate to a three dimensional printing apparatus and defining an active area on the non-conductive polymer substrate, wherein the active area is a portion of a surface of the non-conductive polymer substrate to receive a three dimensional printing. The method may further comprise printing in the active area on the non-conductive polymer substrate with a conductive material to achieve a predesigned configuration in the active area of the non-conductive polymer substrate. The method may further comprise incorporating the patterned non-conductive polymer substrate into a final arrangement.

Other aspects and advantages will become apparent from the following description and the attached claims.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the drawings. It is to be noted, however, that the appended drawings illustrate only typical embodiments of this disclosure and are therefore not to be considered limiting of its scope, for the disclosure may admit to other equally effective embodiments.

Figure 1:
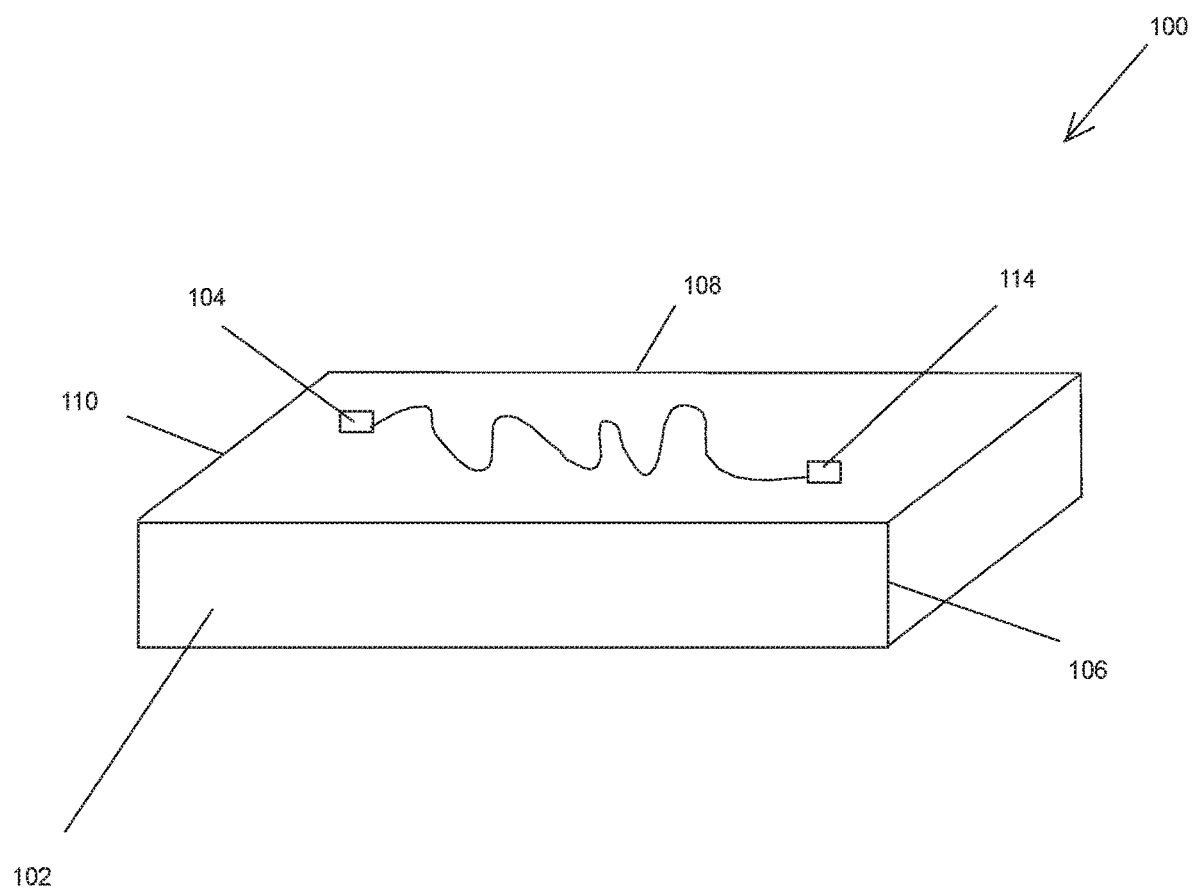
FIG. 1 is a side perspective view of a three (3) dimensional printed resistor.

To facilitate understanding, identical reference numerals have been used, where possible, to designate identical elements that are common to the figures ("FIGS."). It is contemplated that elements disclosed in one embodiment may be beneficially utilized on other embodiments without specific recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the claims except where explicitly recited in a claim. Likewise, reference to "the disclosure" shall not be construed as a generalization of any inventive subject matter disclosed herein and shall not be considered to be an element or limitation of the claims except where explicitly recited in a claim.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art, that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point are used in this description to more clearly describe certain embodiments.

Aspects of the disclosure relate to three (3) dimensional printing. More specifically, aspects of the disclosure relate to creating electrical components using three dimensional printing to allow rapid prototyping of electrical components used in a downhole environment. The three dimensional printing, commonly called additive manufacturing, can quickly replicate a design present in a design drawing. The three dimensional printing may be quickly altered to allow for changes in the overall design to occur. These changes can be, for example, creating a larger version of a design previously created. In other non-limiting embodiments, a smaller version of a design may be created. In still other embodiments, different materials may be used to create the traces within a substrate, thus altering the overall capability of the electrical component. In one embodiment, a trace may use a conductive copper alloy on the substrate. In other embodiments, a conductive silver alloy may be used on the substrate. In a still further embodiment, a gold alloy may be used on the substrate. In other embodiments, different traces may use different materials, thus silver may be used in some traces, while copper may be used within other traces.

Other alterations may be made to designs to impact the overall capability of a resistor. In some embodiments, a specific trace may be expanded in scope or reduced in scope to decrease or increase the resistance of the resistor. In still other embodiments, additional traces may be added to change the properties of the resistor.

The oil and gas industry has consistently tried to produce components that may withstand pressures, temperatures, shock and vibration regimes in the downhole environments that are encountered. In some embodiments, the pressure that may be experienced by downhole components may exceed 30,000 pounds per square inch. Temperatures may exceed 200° Celsius C. As these values may occur simultaneously, electrical components experiencing such values may either decrease in efficiency or stop functioning altogether.

Some electrical components used are related to safety devices to prevent environmental problems from occurring. In some embodiments, electrical signals are used to trigger closure valves to "seal in" a well to prevent contents of the well from erupting. Such functions are vital and must be performed in a consistent and reliable manner when required. While conventionally made components can provide such functionality, such components are expensive to design and manufacture.

Embodiments of the disclosure herein provide an alternative method for producing electrical components that are configured to withstand the rigors of downhole environments. Methods used for production of the components may be altered to provide for quick prototyping, reducing the time for production of components.

In some embodiments, film resistors may be made from a metal film. Such metal film resistors may have better temperature stability than other conventional carbon based units. Such metal film resistors may also have lower noise properties and may be used in high frequency applications.

In other embodiments, methods and apparatus produced are related to thick film resistors. Such thick film resistors are manufactured by placing a conductive paste of ceramic and metal, called CERMET, onto a substrate. In some embodiments, the substrate may be an alumina ceramic substrate.

Referring to FIG. 1, a perspective view of a three (3) dimensional printed resistor 100 is illustrated. In the illustrated embodiment, a substrate 102 is provided. The substrate 102 is configured with a thickness 106, a length 108 and a depth 110. The substrate, in one embodiment, is a non-conductive polymer and an active area is where a resistive pattern 112 is provided. The substrate 102 can be a standalone material which could be then assembled on a conventional printed circuit board or a three (3) dimensional printed circuit board (PCB). The resistive pattern 112 can be laid as a distributed pattern or clustered pattern to get the required resistance value while keeping parasitic losses to a minimum. In the illustrated embodiment, the resistive pattern 112 is configured to extend from a first pad 104 or connection to a second pad 114 or connection. The amount of the length of travel may depend upon the amount of resistance necessary for the resistor 100.

In other embodiments, a second resistor may be located upon the same substrate 102. Thus, resistors may be placed in parallel to one another to achieve different resistances necessary for operation. As will be understood, different materials may be used in creating each of the individual resistors. As an example, the resistive pattern 112 in the first resistor may be constructed of copper, while a second resistive pattern may be made in silver. In these embodiments, pads 104, 114 may be shared be different resistors. In other embodiments, each resistor 100 may be configured with a discrete starting pad and ending pad. As will be understood by a person skilled in the art, the pads 104, 114 may be configured to interface with a PCB ("printed circuit board") that may house other electrical components.

In still other embodiments, while the resistive pattern 112 and pads 104, 114 are located on a top surface 120 of the substrate 102, other configurations may include providing a resistive pattern on a bottom surface 122 of the substrate 102. In such embodiments, additive manufacturing, three dimensional printing, may be used on both the top surface 120 and bottom surface 122. Such printing may be done sequentially or may be done in parallel, if fast production is necessary.

In some embodiments, powder bed fusion techniques ("PBF") may be used. In this type of additive manufacturing process, an array of materials may be used. Geometrical complexity may be high. For example, a resistor may be created upon a substrate in a complex fashion. In some embodiments, selective laser sintering may be used, wherein a laser is used to melt a substrate or powder to a desired format. In other embodiments, electron beam melting may be used to produce an additive manufacturing component. In another non-limiting embodiment, a laminated object manufacturing technique may be used to both cut and join shapes together.

A 3D printed resistor for downhole applications will be designed to fit the application conditions (in terms of power requirements, value, size, tolerance) with ease of assembly (an integrated design or stand-alone). The 3D printing is also configured to facilitate quick prototyping of the resistor to avoid long lead times experienced for conventional manufacturing.

Figure 2:
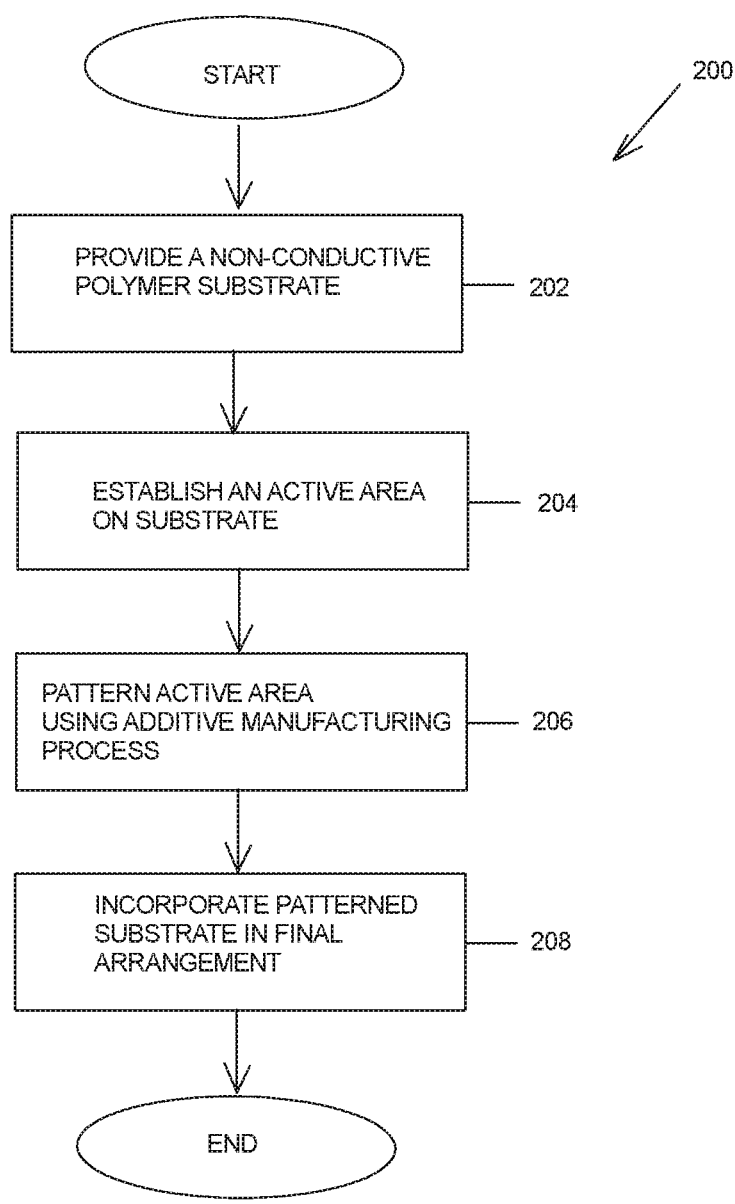
FIG. 2 is a method of making a downhole electrical component in accordance with an example embodiment of the disclosure.

Referring to FIG. 2, a method 200 for producing a three dimensional printed resistor for downhole applications is illustrated. At 202, the method may provide for providing a non-conductive polymer substrate. At 204, the method may continue with establishing an active area on the non-conductive polymer substrate provided. At 206, the method may continue with patterning an active area using an additive manufacturing process. At 208, the method may proceed with incorporating the patterned substrate into a final arrangement. The final arrangement may be, for example, a conventional printed circuit board or a 3D printed circuit board.

Figure 3:
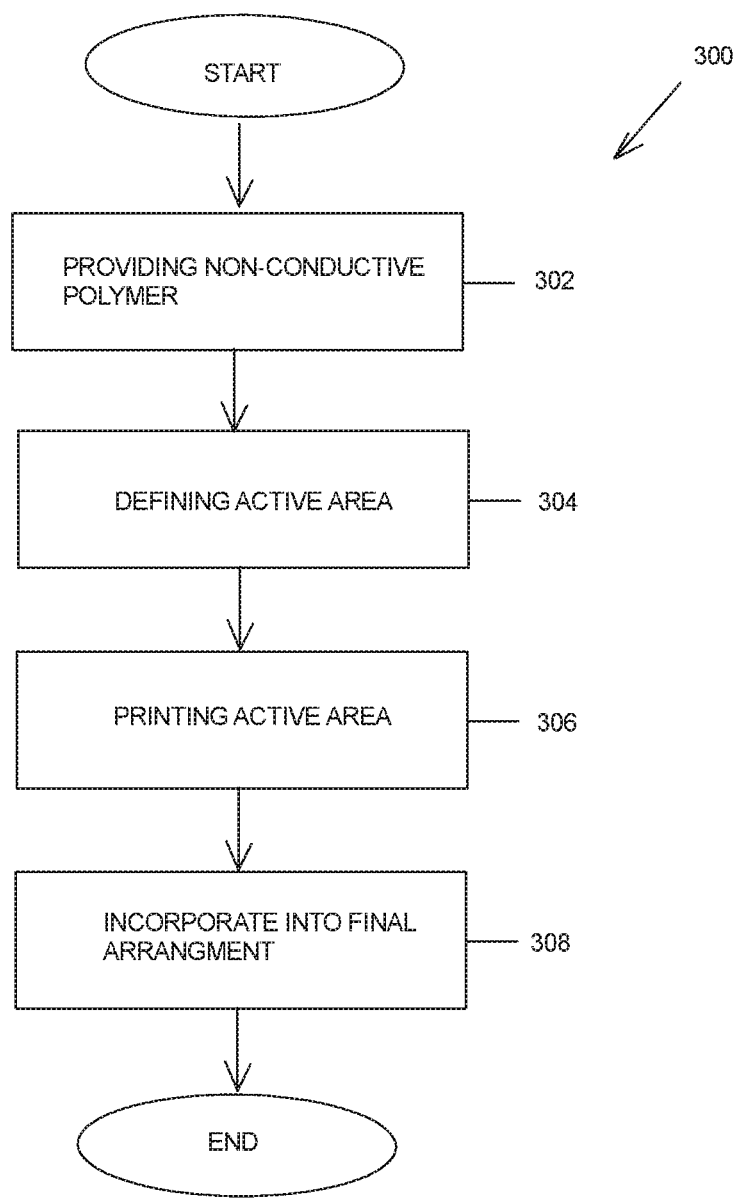
FIG. 3 is a second method of making a downhole electrical component in accordance with one example embodiment of the disclosure.

Referring to FIG. 3, a second method 300 for producing a downhole electrical component is disclosed, comprising, at 302, providing a non-conductive polymer substrate to a three dimensional printing apparatus. The method may also provide, at 304, for defining an active area on the non-conductive polymer substrate, wherein the active area is a portion of a surface of the non-conductive polymer substrate to receive a three dimensional printing. The method may further provide, at 306, for printing in the active area on the non-conductive polymer substrate with a conductive material to achieve a predesigned configuration in the active area of the non-conductive polymer substrate. The method may also provide, at 308, for incorporating the patterned non-conductive polymer substrate into a final arrangement.

In each method for FIG. 2 and FIG. 3, the printed active area may rolled and encapsulated in an insulating material. In these arrangements, a first pad 104 may be connected to a connecting lead. In a furtherance of the arrangement, a second pad 114 may be connected to a different connecting lead as described below.

Figure 4:
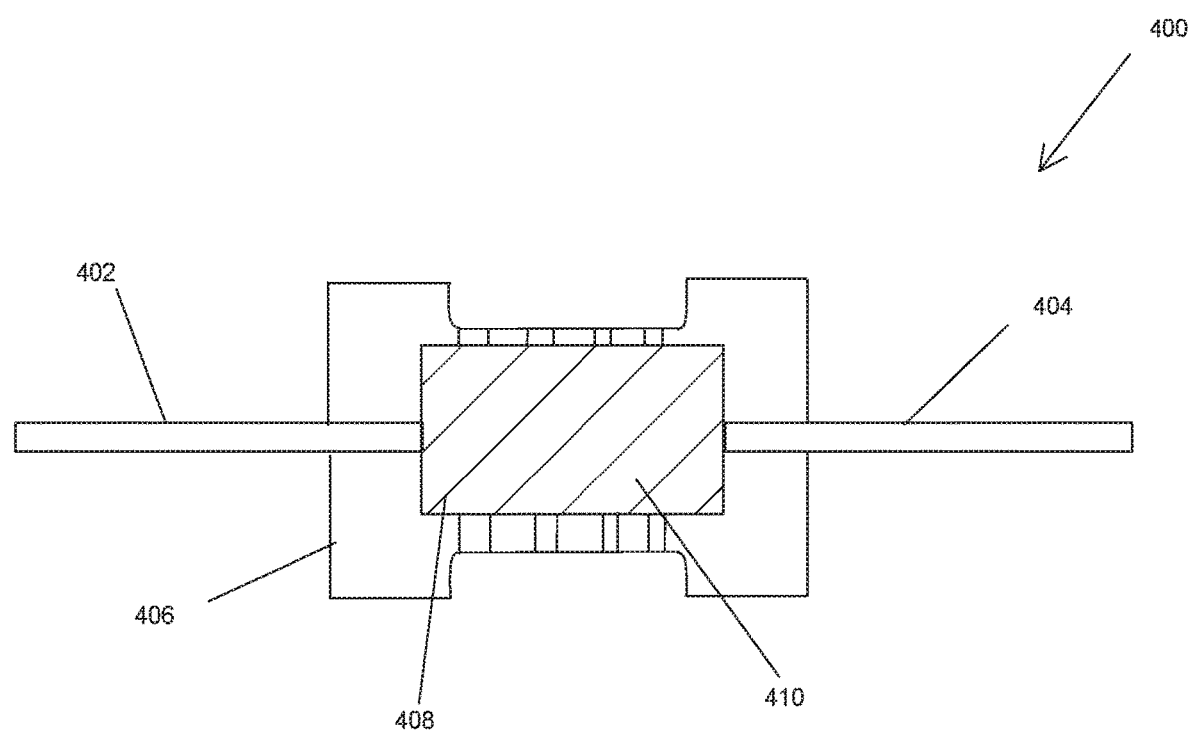
FIG. 4 is a film type resistor in accordance with an example embodiment of the disclosure.

Referring to FIG. 4, a film resistor 400 is illustrated wherein components of the resistor 400 may be constructed by additive manufacturing, three dimensional printing. The film resistor 400 is configured with a first end 402 and a second end 404. The first end 402 and the second end 404 are connecting leads that are used to connect the resistor to other components of a electrical system, such as a PCB board. The thin resistive film 410 produced by the methods in FIG. 2 or FIG. 3 is wound in a spiral groove 408 configuration such that a portion of the resistive pattern contacts both the first end 402 and the second end 404. An insulating material, such as a ceramic, may be spread over an exterior of the film resistor 400, such that the only conductive portions of the film resistor 400 are the first end 402 and the second end 404 for connection to electrical apparatus.

The first step of development is to identify the requirements and develop the prototypes with known materials. The prototype parts will be tested for the downhole conditions including high temperature as well as a shock test. The second step is to identify the different material sets to improve the performance (for example, resistivity, power rating) and develop multiple prototypes.

In the embodiments illustrated, the methods and apparatus provide a three (3) dimensional printed resistor that is capable of withstanding anticipated temperature and shock conditions of a downhole environment. This apparatus may withstand 30,000 psi and 200° C. By using additive manufacturing techniques, conventional film resistors may be replaced with newly designed resistors created by 3D printing. By choosing the right material sets, designs can achieve the optimum precision and achieve a temperature coefficient of resistor ("RCE") required for downhole applications. Additive manufacturing facilities may use different thickness and depth of substrates, allowing for greater flexibility compared to conventional apparatus.

In other embodiments, the methods may provide an economical alternative to conventional resistor apparatus that allows for quick prototyping. Excessive winding of materials that are commonplace in manufacturing of conventional resistors is avoided altogether. As the manufacturing can be controlled by high precision computers and lasers, alterations to designs may be achieved with minimal delay. Conventional resistor alterations require extensive mechanical reworking of machines used in the winding process.

As the production of components is quickly scalable, multiple production lines can be controlled through a single computer, rather than having multiple mechanical machines used in winding a single type of resistor.

There is a further need to produce electrical components, wherein such production minimizes impacts to the environment.

In an embodiment, a method for producing a downhole electrical component is disclosed. The method may comprise providing a non-conductive polymer substrate, establishing an active area on the non-conductive polymer substrate, patterning the active area on the non-conductive polymer substrate with a conductive material through an additive manufacturing process, and incorporating the patterned non-conductive polymer substrate into a final arrangement.

In another embodiment, the method may be performed wherein the patterning the active area is performed as a distributed pattern.

In another embodiment, the method may be performed wherein the patterning the active area is performed as a clustered pattern.

In another embodiment, the method may be performed wherein the patterning the active area on the non-conductive polymer substrate includes creating at least two connection pads.

In another embodiment, the method may be performed wherein the final arrangement is a printed circuit board.

In another embodiment, the method may be performed wherein the final arrangement is a three dimensional printed circuit board.

In another embodiment, the method may be performed wherein the additive manufacturing process incorporates at least one powder bed fusion technique.

In another embodiment, the method may be performed wherein the additive manufacturing process incorporates a selective laser sintering.

In one embodiment, an arrangement is disclosed. The arrangement may comprise a substrate having at least two areas, wherein a first of the two areas is an active area and a second of the two areas is a passive area. The arrangement may also comprise at least one resistive pattern placed in a surface of the active area, the at least one resistive pattern placed onto the substrate through an additive manufacturing process. The arrangement may also comprise a first connection pad connected to the at least one resistive pattern placed in the surface of the active area. The arrangement may also comprise a second connection pad connected to the at least one resistive pattern placed in the surface of the active area.

In another embodiment, the arrangement may be configured wherein the resistive pattern is made of a pattern created with a metallic component one of on and within the substrate.

In a still further embodiment, the arrangement may be configured wherein the substrate is non-conductive polymer.

In another embodiment, the arrangement may be configured wherein the resistive pattern is a distributed pattern.

In another embodiment, the arrangement may be configured wherein the resistive pattern is a clustered pattern.

In another embodiment, a method for producing a downhole electrical component is disclosed. The method may comprise providing a non-conductive polymer substrate to a three dimensional printing apparatus and defining an active area on the non-conductive polymer substrate, wherein the active area is a portion of a surface of the non-conductive polymer substrate to receive a three dimensional printing. The method may further comprise printing in the active area on the non-conductive polymer substrate with a conductive material to achieve a predesigned configuration in the active area of the non-conductive polymer substrate. The method may further comprise incorporating the patterned non-conductive polymer substrate into a final arrangement.

In another non-limiting embodiment, the method may be performed wherein the printing in the active area involves creating a distributed pattern.

In another non-limiting embodiment, the method may be performed wherein the printing in the active area involves creating a clustered pattern.

In another non-limiting embodiment, the method may be performed wherein the incorporating the patterned non-conductive polymer substrate into the final arrangement comprises winding the film resistor such that a first pad of the film resistor contacts a first end connecting lead, connecting a portion the first pad of the film resistor to the first end connecting lead and connecting a portion of a second pad of the film resistor to a second end connecting lead.

In another non-limiting embodiment, the method may further comprise coating at least a portion of the wound film resistor with an insulating material.

In another non-limiting embodiment, the method may further comprise marking an outside surface of the insulating material with a code signifying a resistance between the first end connecting lead and the second end connecting lead.

In another example embodiment, the method may further comprise curing the insulating material.

While embodiments have been described herein, those skilled in the art, having benefit of this disclosure, will appreciate that other embodiments are envisioned that do not depart from the inventive scope. Accordingly, the scope of the present claims or any subsequent claims shall not be unduly limited by the description of the embodiments described herein.

What is claimed is:

1. An arrangement, comprising:
    a substrate having at least two areas, wherein a first of the two areas is an active area and a second of the two areas is a passive area;
    at least one resistive pattern placed in a surface of the active area, the at least one resistive pattern placed onto the substrate through an additive manufacturing process;
    a first connection pad connected to the at least one resistive pattern placed in the surface of the active area; and
    a second connection pad connected to the at least one resistive pattern placed in the surface of the active area wherein the resistive pattern is made of a pattern created with a metallic component and wherein a first resistive pattern is formed on a top of the substrate and a second resistive pattern is formed on a bottom of the substrate.

2. The arrangement according to claim 1, wherein the substrate is non-conductive polymer.

3. The arrangement according to claim 1, wherein the resistive pattern is a distributed pattern.

4. The arrangement according to claim 1, wherein the resistive pattern is a clustered pattern.

\* \* \* \* \*